(12) United States Patent
Usui

(10) Patent No.: US 6,611,157 B2
(45) Date of Patent: Aug. 26, 2003

(54) DIFFERENTIAL SIGNAL OUTPUT CIRCUIT

(75) Inventor: Toshimasa Usui, Chino (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 10/123,082

(22) Filed: Apr. 12, 2002

(65) Prior Publication Data

US 2002/0167333 A1 Nov. 14, 2002

(30) Foreign Application Priority Data

Apr. 17, 2001 (JP) ........................................ 2001-118768

(51) Int. Cl.$^7$ ................................................ H03B 1/00
(52) U.S. Cl. ...................... 327/112; 327/108; 327/563; 326/83
(58) Field of Search ............................. 327/108, 112, 327/170, 65, 66, 423, 424, 588, 389, 391, 379, 563; 326/83, 27, 86; 330/261

(56) References Cited

U.S. PATENT DOCUMENTS 5,959,472 A * 9/1999 Nagamatsu et al. ......... 327/108
6,111,431 A * 8/2000 Estrada ........................ 326/83
6,292,028 B1 * 9/2001 Tomita ........................ 326/86
6,313,662 B1 * 11/2001 Ide ............................... 326/83
6,370,066 B1 * 4/2002 Nagano ................. 365/189.09

FOREIGN PATENT DOCUMENTS

JP          10-303730         11/1998
JP          2000-31810 A  *  1/2000
JP          2000-68813 A  *  3/2000

* cited by examiner

*Primary Examiner*—Terry D. Cunningham
*Assistant Examiner*—Long Nguyen
(74) *Attorney, Agent, or Firm*—Harness, Dickey & Pierce, P.L.C.

(57) ABSTRACT

A differential signal output circuit is equipped with a first output stage including serially connected transistors QP1 and QN1, a second output stage including serially connected transistors QP2 and QN2, an input device 11–13 that supplies two signals having mutually reversed phases to the gate of the first output stage and the gate of the second output stage, respectively, based on an input signal, and a current supply device QP3 that supplies specified drain current to the first and second output stages.

4 Claims, 6 Drawing Sheets

DIFFERENTIAL SIGNAL OUTPUT CIRCUIT

BACKGROUND OF THE INVENTION

1. Technical Field of the Invention

The present invention relates to a differential signal output circuit that outputs a differential signal, and more particularly to an LVDS output circuit that is used for an LVDS (Low Voltage Differential Signal) interface that uses a differential signal of a low voltage.

2. Conventional Art

Generally, efforts to lower power supply voltages are being continued to reduce power consumption by circuits. An LVDS interface is a differential small amplitude interface that is being subject to the standardization conducted at IEEE; and its details including signal levels are defined in the standard.

Japanese laid-open patent application (Tokkai) HEI 9-214314 describes an outline of the LVDS interface. FIG. 5 shows a summary of the LVDS interface. As FIG. 5 shows, a driver block (differential signal output circuit) 1 and a receiver block 2 are connected to each other by a forward transmission line 3 and a return transmission line 4. Each of the forward transmission line 3 and the return transmission line 4 has ideally a property impedance of 50Ω.

A power supply potential $V_{DD}$ at a high potential side and a power supply potential $V_{SS}$ at a lower potential side (i.e., a ground potential in here) are supplied to the driver block 1, and the driver block 1 includes a driver chip 51 that outputs output current $I_0$. Also, the receiver block 2 includes a receiver chip 52 that composes a differential amplification circuit.

The value of a terminal resistance $R_T$ in the receiver chip 52 is set to 100Ω in order to match the property impedances of the forward transmission line 3 and the return transmission line 4. In this case, if the value of the output current $I_0$ is ±3 mA, a potential difference generated between both ends of the terminal resistance $R_T$ is 300 mV. The LVDS interface standard sets a high level signal potential at 1.35V, and a low level signal potential at 1.05V.

The driver block 1 outputs an output current $I_0$ through the forward transmission line 3 and the return transmission line 4 based on an input signal supplied, for example, at the CMOS level. The receiver block 2 differentially amplifies a potential difference between both ends of the terminal resistor $R_T$ generated by the output current $I_0$ of the driver block 1, and converts the same to, for example, a signal at the CMOS level.

FIG. 6 shows a circuit structure of a driver block (differential signal output circuit) 1. An input signal that is applied to an input terminal is inverted by an inverter circuit 41. An output of the inverter circuit 41, on one hand, passes through a buffer circuit 42, is inverted by an inverter circuit 43 and supplied to gates of N-channel output transistors QN41 and QN44; and on the other hand, passes through inverter circuits 44 and 45 and is supplied non-inverted to gates of N-channel output transistors QN42 and QN43. The buffer circuit 42 includes P-channel transistor QP4 and N-channel transistor QN4, and compensates for a delay corresponding to a delay time of the inverter circuit 44.

Specified current is supplied by P-channel transistor QP3 and N-channel transistor QN3 to a first output stage that includes the output transistors QN41 and QN42 and a second output stage that includes the output transistors QN43 and QN44.

In the driver block 1 thus structured, the first output stage supplies to an output terminal A an output current having the same phase as that of the input signal, and the second output stage supplies to an output terminal B an output current having a reversed phase with respect to the input signal. In the example described above, a potential difference generated between the output terminal A and the output terminal B is 300 mV.

However, as the value of the power supply voltage $(V_{DD}-V_{SS})$ is further reduced, the voltage at the output terminal would not rise to a specified value due to a voltage fall that is generated at the output transistors QN41 and QN43 on the higher potential side, and the output waveform is clipped.

For example, let us assume that, when the power supply voltage $(V_{DD}-V_{SS})$ is 2.5V, the voltage fall at the output transistors QN41 and QN42 on the higher potential side becomes to be 1.3V due to variations. In this instance, even when the voltage fall at the transistor QP3 is 0V, the potential at the output terminal rises only up to 1.2V. This value is lower than 1.35V that is a standard value of the LVDS interface.

Furthermore, due to variations in the resistance value of diffusion resistance, variations in the characteristics between the P-channel transistor QP3 and N-channel transistor QN3 and temperature changes, problems occurs in that the potential at the output terminal shifts.

Accordingly, in view of the problems described above, it is a first object of the present invention to provide a differential signal output circuit in which clipping of an output waveform is prevented even when the circuit is used under a low power supply voltage. Also, it is a second object of the present invention to provide a differential signal output circuit that has a stable potential at its output terminal.

SUMMARY OF THE INVENTION

To solve the problems described above, a differential signal output circuit in accordance with a first aspect of the present invention pertains to a differential signal output circuit that outputs a differential signal based on an input signal, the differential signal output circuit comprising: a first output stage, including a first P-channel transistor and a first N-channel transistor that are serially connected, that outputs a first output signal composing the differential signal from a drain based on a signal applied to a gate; a second output stage, including a second P-channel transistor and a second N-channel transistor that are serially connected, that outputs a second output signal composing the differential signal from a drain based on a signal applied to a gate; an input device that supplies two signals having mutually reversed phases to the gate of the first output stage and the gate of the second output stage, respectively, based on an input signal; and a current supply device that supplies specified current to the first and second output stages.

Here, the current supply device may include a first device that supplies current to a first connection point between the first output device and the second output device, and a second device that maintains a second connection point between the first output device and the second output device at a specified potential. In this case, the first output device may include a third P-channel transistor that flows current from a power supply potential at a higher potential side to sources of the first and second P-channel transistors; and the second output device may include a third N-channel transistor that flows current from the sources of the first and second N-channel transistors to a power supply potential at a lower potential side, and a control circuit that controls output current of the third N-channel transistor to maintain the sources of the first and second N-channel transistors at a specified potential.

Alternatively, the current supply device may include a third transistor that supplies current to the first and second output stages, a fourth transistor that forms a current mirror with the third transistor, a group of elements that is serially connected to the fourth transistor, and a control circuit that controls output current of the third transistor based on a potential at a specified location among the group of elements. Here, the current supply device may preferably supply current to the first and second output stages such that an average value of an output potential of the first output stage and an output potential of the second output stage becomes to be a specified potential.

In accordance with the first aspect of the present invention, when a signal at a high level is outputted, an output signal having large amplitude can be obtained even when a low power supply voltage is used because the voltage fall at the P-channel output transistor is small.

A differential signal output circuit in accordance with a second aspect of the present invention pertains to a differential signal output circuit that outputs a differential signal based on an input signal, the differential signal output circuit comprising: a first output stage, including a first transistor and a second transistor that are serially connected, that outputs a first output signal composing the differential signal from a drain; a second output stage, including a third transistor and a fourth transistor that are serially connected, that outputs a second output signal composing the differential signal from a drain; an input device that supplies two signals having mutually reversed phases to gates of the first and fourth transistors and gates of the second and third transistors, respectively, based on an input signal; a fifth transistor that supplies current to the first and second output stages; a sixth transistor that forms a current mirror with the fifth transistor; a group of elements that is serially connected to the sixth transistor; and a control circuit that controls output current of the first transistor based on a potential at a specified location among the group of elements.

Here, the current supply device may supply current to the first and second output stages such that an average value of an output potential of the first output stage and an output potential of the second output stage becomes to be a specified potential.

In accordance with the second aspect of the present invention, the drain current of the output transistors is controlled based on a potential at a specified location among the group of elements that is connected to the current mirror to stabilize the potential at the output terminal.

DETAILED DESCRIPTION OF THE PREFERRED EMBODIMENTS

Embodiments of the present invention will be described below with reference to the accompanying drawings. It is noted that the same components are indicated by the same reference numbers, and duplicate description is omitted.

Figure 1:
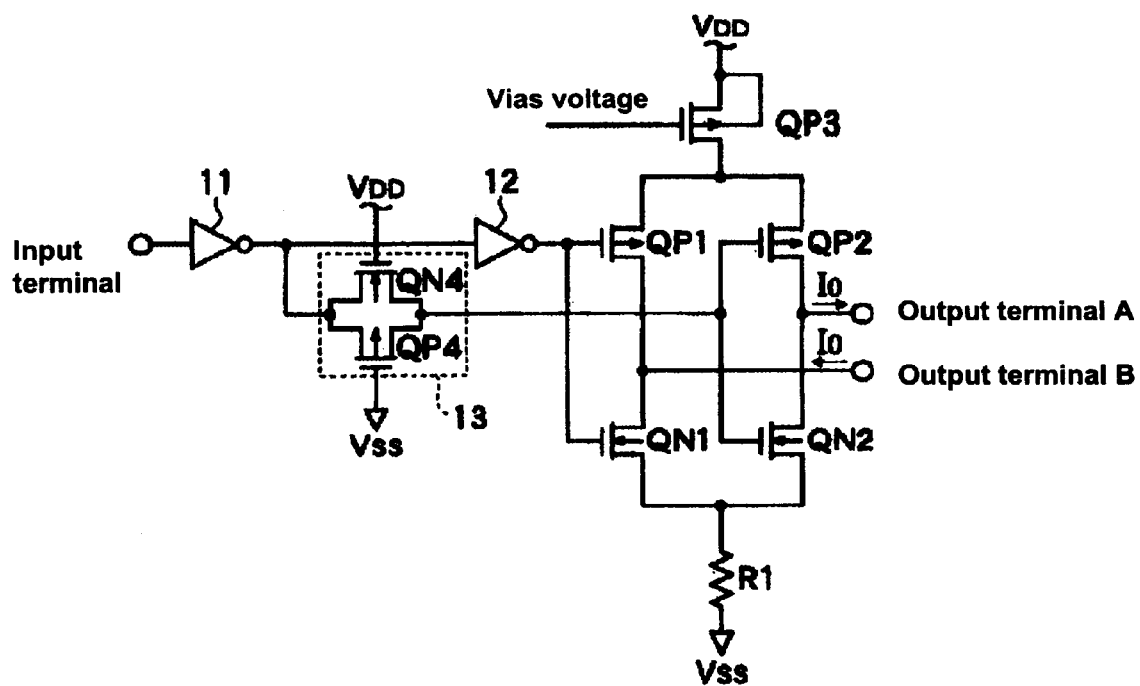
FIG. 1 shows a circuit diagram of a structure of a differential signal output circuit in accordance with a first embodiment of the present invention.
Figure 5:
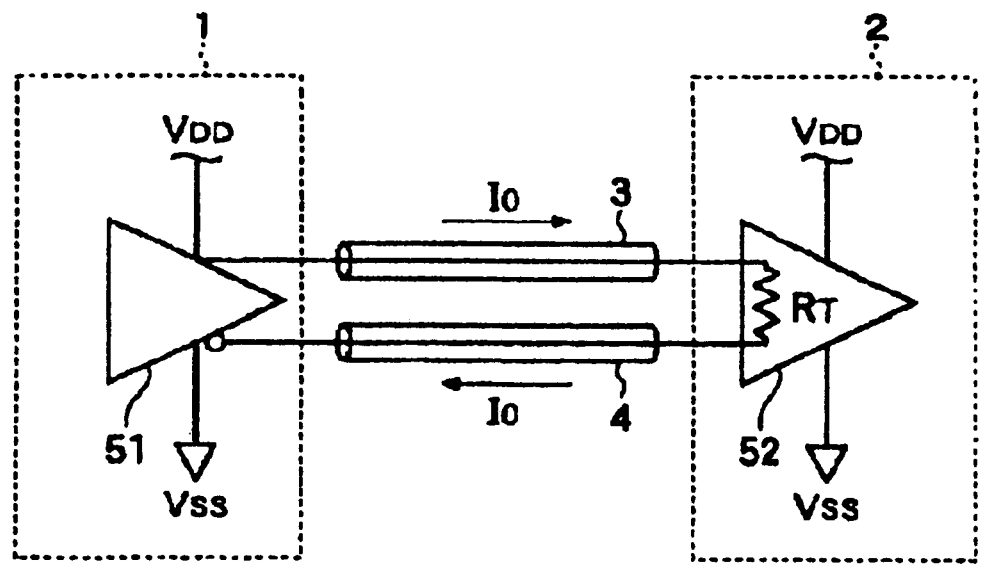
FIG. 5 shows a summary of an LVDS interface described in Japanese laid-open patent application HEI 9-214314.
Figure 6:
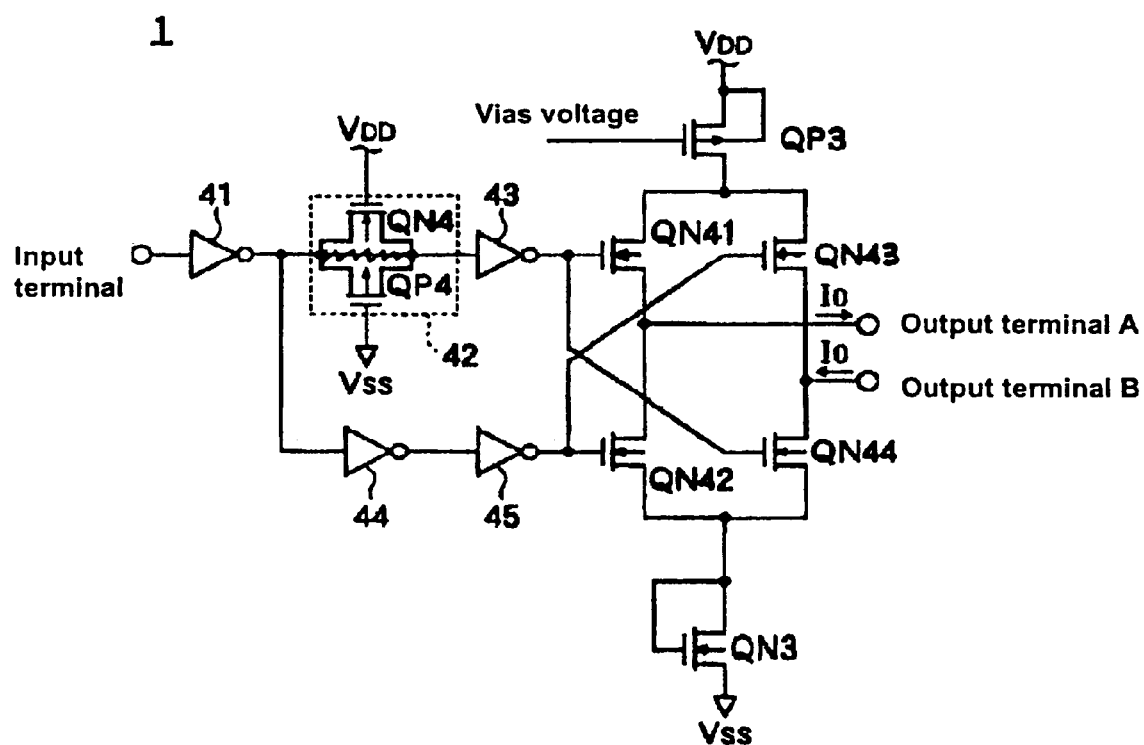
FIG. 6 shows a circuit diagram of the structure of a driver block (differential signal output circuit) described in Japanese laid-open patent application HEI 9-214314.

FIG. 1 shows a circuit diagram of a structure of a differential signal output circuit (driver block) in accordance with a first embodiment of the present invention. The differential signal output circuit is used in an LVDS interface such as the one shown in FIG. 5. The differential signal output circuit outputs an output current $I_0$ through a forward transmission line 3 and a return transmission line 4 based on, for example, an input signal supplied at a CMOS level. A receiver block differentially amplifies a potential difference generated between both ends of a terminal resistance $R_T$ by the output current I0, and converts the same to, for example, a signal at a CMOS level.

As shown in FIG. 1, an input signal applied to the input terminal is inverted by an inverter circuit 11. An output of the inverter circuit 11 is, on one hand, inverted by an inverter circuit 12 and supplied to gates of output transistors QP1 and QN1; and on the other hand, is passed through a buffer circuit 13 and supplied non-inverted to gates of output transistors QP2 and QN2. The buffer circuit 13 includes a P-channel transistor QP4 and an N-channel transistor QN4, and compensates for a delay corresponding to a time delay in the inverter circuit 12.

In the present embodiment, a P-channel transistor and an N-channel transistor serially connected to one another are used as an output transistor. A drain of the P-channel output transistor QP1 and a drain of the N-channel output transistor QN1 are connected to an output terminal B. Similarly, a drain of the P-channel output transistor QP2 and a drain of the N-channel output transistor QN2 are connected to an output terminal A.

A source of the output transistor QP1 and a source of the output transistor QP2 are mutually connected at a first connection point. The P-channel transistor QP3 supplies current from a power supply potential $V_{DD}$ at a higher potential side to the first connection point according to a bias voltage. Also, a source of the output transistor QN1 and a source of the output transistor QN2 are mutually connected at a second connection point. A diffusion resistor R1 is connected between the second connection point and a power supply potential $V_{SS}$ (a ground potential in here) at a lower potential side.

An operation of the differential signal output circuit thus composed will be described. The first output stage supplies to the output terminal B an output current $I_0$ having a reversed phase with respect to the input signal. The second output stage supplies to the output terminal A an output current $I_0$ having the same phase as that of the input signal. When the value of the output current $I_0$ is 3 mA and the terminal resistance $R_T$ of the receiver block is 100Ω, a potential difference generated between the output terminal A and the output terminal B is 300 mV. When the P-channel transistors QP1–QP3 are in an ON state, a voltage fall between the source and the drain thereof is very small. Accordingly, even when the power supply voltage ($V_{DD}-$ $V_{SS}$) is 2.5V, the potential at the output terminal A, B can rise close to a maximum of 2.5V. In this manner, in accordance with the present invention, even when a power supply voltage becomes very small, the voltage range of 1.05V–1.35V required for the LVDS interface can be secured.

Figure 2:
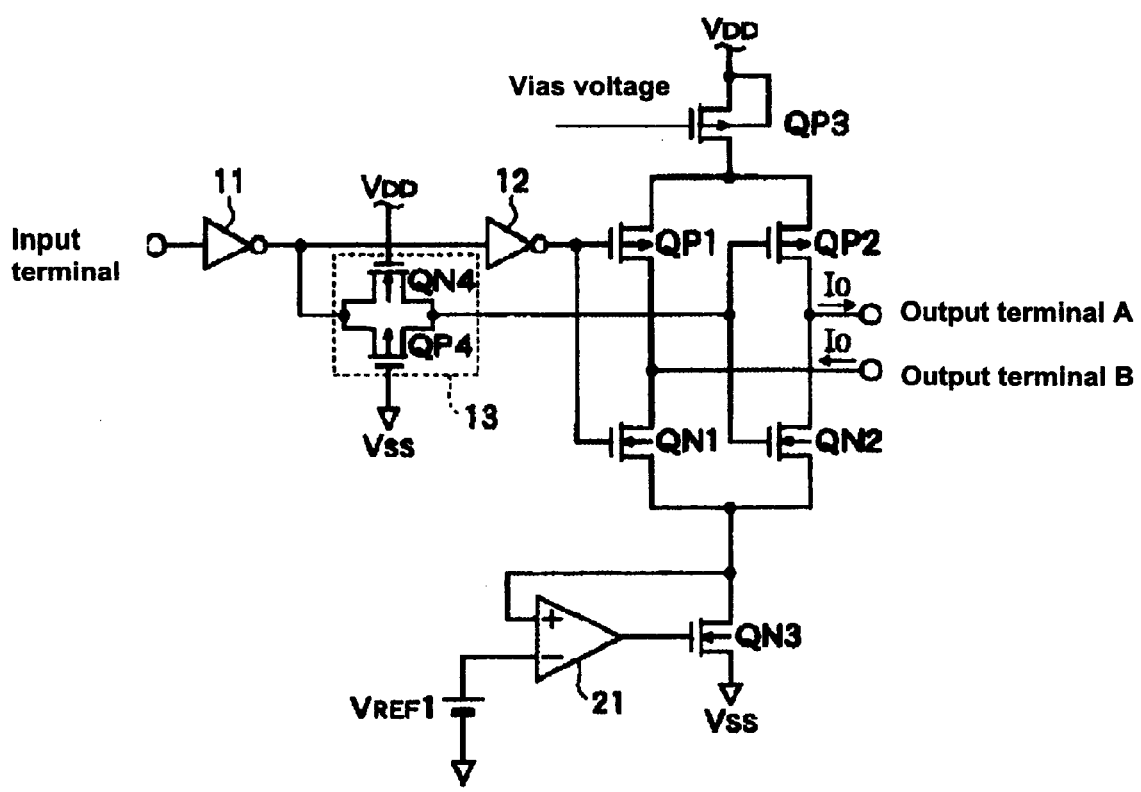
FIG. 2 shows a circuit diagram of a structure of a differential signal output circuit in accordance with a second embodiment of the present invention.

Next, a second embodiment of the present invention will be described. FIG. 2 shows a circuit diagram of a structure of a differential signal output circuit in accordance with a second embodiment of the present invention.

As shown in FIG. 2, in the present embodiment, the resistor R1 in the first embodiment (shown in FIG. 1) is replaced with an N-channel transistor QN3 and a comparator 21 that is composed of an operation amplifier or the like. The transistor QN3 flows drain current from the sources of the output transistors QN1 and QN2 toward the power supply potential $V_{SS}$ on the lower potential side (a ground potential in here). An inversion input of the comparator 21 is connected to a reference potential $V_{REF}$ 1. An output potential of the comparator 21 is supplied to the gate of the transistor QN3.

With the structure described above, the comparator 21 operates in a manner to retain the sources of the output transistors QN1 and QN2 at the reference potential $V_{REF}$ 1. When a diffusion resistor R1 (see FIG. 1) is used as in the first embodiment, potentials at the output terminals A, B substantially vary because variations in the diffusion resistor R1 are substantially large. In contrast, in accordance with the present embodiment, since the sources of the output transistors QN1 and QN2 are retained at the reference potential $V_{REF}$ 1, variations in the potentials at the output terminals A, B can be reduced. Accordingly, a differential signal output circuit that is difficult to be affected by variations in the semiconductor device manufacturing process can be provided.

Figure 3:
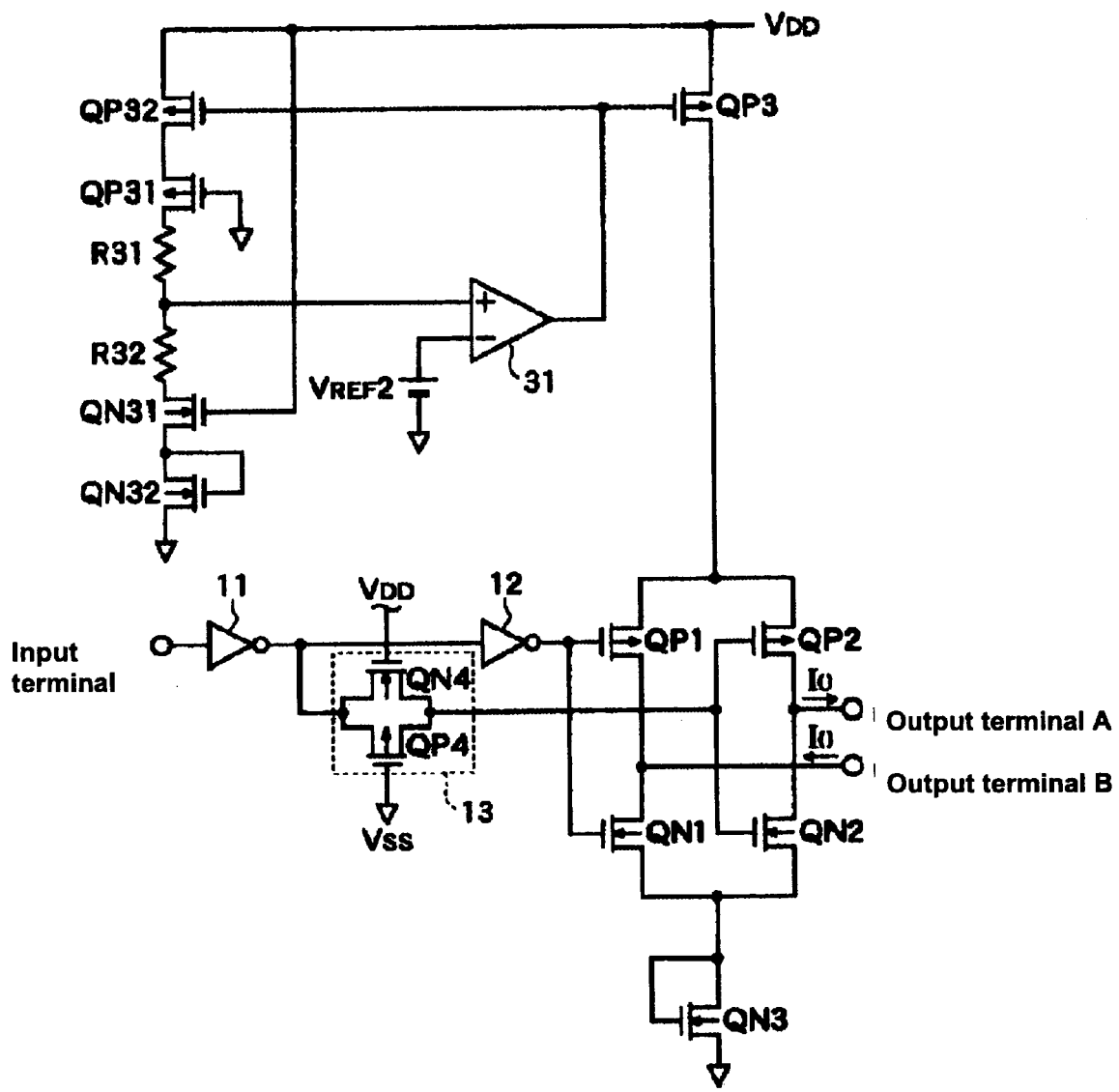
FIG. 3 shows a circuit diagram of a structure of a differential signal output circuit in accordance with a third embodiment of the present invention.

Next, a third embodiment of the present invention will be described. FIG. 3 shows a circuit diagram of a structure of a differential signal output circuit in accordance with a third embodiment of the present invention. The present embodiment is characteristic in its bias voltage supply circuit that supplies a bias voltage to the gate of the transistor QP3.

As shown in FIG. 3, a P-channel transistor QP32 forms a current mirror with the transistor QP3. The transistor QP32 serially connects to a P-channel transistor QP31, resistors R31 and R32, and N-channel transistors QN31 and QN32. These elements are provided to correspond to, for example, the P-channel transistor QP1 in the first output stage, the terminal resistance $R_T$ of the receiver block (100Ω=50Ω×2 in the present embodiment), the N-channel transistor QN2 in the second output stage, and the N-channel transistor QN3, respectively. The resistance value of each of the resistance R31 and the resistance R32 is 50Ω to match the resistance value of the terminal resistance $R_T$ of the receiver block. Here, the potential at the connection point between the resistors R31 and R32 corresponds to an average value of the potentials generated at the output terminals A, B.

A potential at the connection point between the resistors R31 and R32 is supplied to a non-inversion input of the comparator 31 that is formed from an operation amplifier or the like. A reference potential $V_{REF}$ 2 is supplied to an inversion input of the comparator 31. In the present embodiment, the reference potential $V_{REF}$ 2 is set at 1.2V that is a central potential of the LVDS signal. An output potential of the comparator 31 is supplied to gates of the transistors QP3 and QP32 that form the current mirror. The comparator 31 controls the gate potentials of the transistors QP3 and QP32 that form the current mirror so that the potential at the connection point between the resistors R31 and R32 becomes equal to the reference potential $V_{REF}$ 2 (1.2V in here). By this, the average value of the voltages generated at the output terminals A, B is controlled to be at 1.2V without regard to temperature changes.

Figure 4:
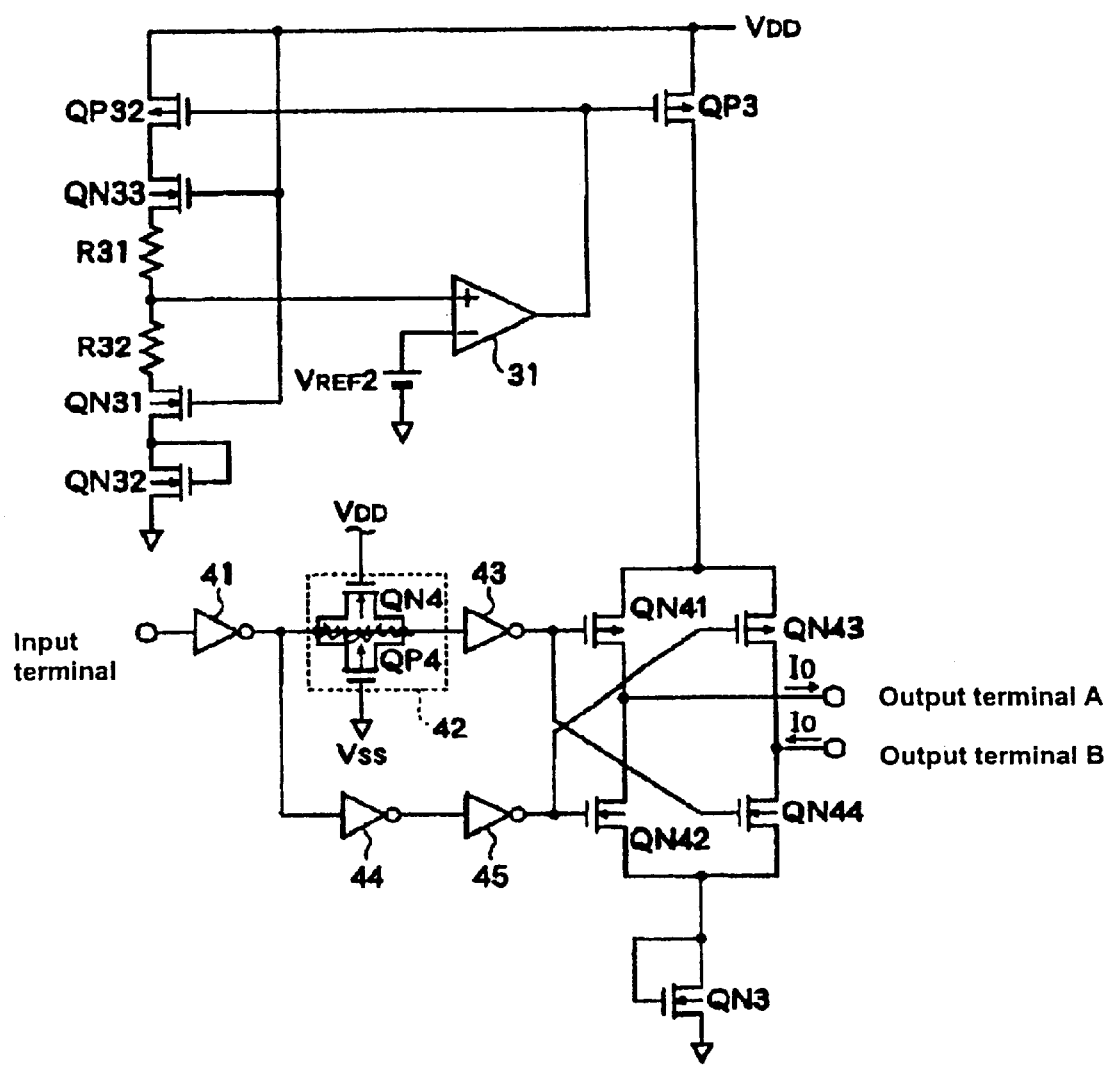
FIG. 4 shows a modified example of the differential signal output circuit in accordance with the third embodiment of the present invention.

The bias voltage supply circuit described above may be applied to a differential signal output circuit in which its output transistor is formed only from N-channel transistors or P-channel transistors. FIG. 4 shows an example of a differential signal output circuit in which an output transistor is formed only from N-channel transistors.

As shown in FIG. 4, an input signal that is applied to an input terminal is inverted by an inverter circuit 41. An output of the inverter circuit 41, on one hand, passes through a buffer circuit 42, is inverted by an inverter circuit 43 and supplied to gates of output transistors QN41 and QN44; and on the other hand, passes through inverter circuits 44 and 45 and is supplied non-inverted to gates of N-channel output transistors QN42 and QN43. The buffer circuit 42 includes P-channel transistor QP4 and N-channel transistor QN4, and compensates for a delay corresponding to a delay time of the inverter circuit 44.

Specified current is supplied by P-channel transistor QP3 and N-channel transistor QN3 to a first output stage that includes the output transistors QN41 and QN42 and a second output stage that includes the output transistors QN43 and QN44.

A P-channel transistor QP32 forms a current mirror with the transistor QP3. The transistor QP32 serially connects to an N-channel transistor QN33, resistors R31 and R32, and N-channel transistors QN31 and QN32. These elements are provided to correspond to, for example, the N-channel transistor QN41 in the first output stage, the terminal resistance $R_T$ of the receiver block (100Ω=50Ω×2 in the present embodiment), the N-channel transistor QN44 in the second output stage, and the N-channel transistor QN3, respectively. The resistance value of each of the resistances R31 and R32 is 50Ω to match the resistance value of the terminal resistance $R_T$ of the receiver block. Here, the potential at the connection point between the resistors R31 and R32 corresponds to an average value of the potentials generated at the output terminals A, B.

A potential at the connection point between the resistors R31 and R32 is supplied to a non-inversion input of the comparator 31 that is formed from an operation amplifier or the like. A reference potential $V_{REF}$ 2 is supplied to an inversion input of the comparator 31. In this example, the reference potential $V_{REF}$ 2 is set at 1.2V, which is a central potential of the LVDS signal. An output potential of the comparator 31 is supplied to gates of the transistors QP3 and QP32 that form the current mirror. The comparator 31 controls the gate potentials of the transistors QP3 and QP32 that form the current mirror so that the potential at the connection point between the resistors R31 and R32 becomes equal to the reference potential $V_{REF}$ 2 (1.2V in here). By this, the average value of the voltages generated at the output terminals A, B is controlled to be at 1.2V without regard to temperature changes.

As described above, the present invention provides a differential signal output circuit in which clipping of an output waveform is prevented even when the circuit is used under a low power supply voltage. Also, the present invention provides a differential signal output circuit that has a stable potential at its output terminal. The entire disclosure of Japanese Patent Application No. 2001-118768 filed Apr. 17, 2001 is incorporated by reference.

What is claimed is:

1. A differential signal output circuit that outputs a differential signal based on an input signal, the differential signal output circuit comprising:

a first output stage, including a first transistor and a second transistor that are serially connected, that outputs a first output signal from a drain of the first and second transistors;

a second output stage, including a third transistor and a fourth transistor that are serially connected, that outputs a second output signal from a drain of the third and fourth transistors;

an input device that supplies two signals having mutually reversed phases to gates of the first and fourth transistors and gates of the second and third transistors, respectively, based on the input signal;

a fifth transistor that supplies current to the first and second output stages;

a sixth transistor that forms a current mirror with the fifth transistor;

a group of elements that is serially connected to the sixth transistor, the group of elements including a first resistor serially connected to a second resistor; and a control circuit that controls output current of the fifth transistor based on a potential at a connection point between the first resistor and the second resistor.

2. A differential signal output circuit according to claim 1, wherein the fifth transistor supplies current to the first and second output stages such that an average value of an output potential of the first output stage and an output potential of the second output stage becomes a specified potential.

3. A differential signal output circuit according to claim 1 wherein:

a resistance value of the first resistor is equivalent to a resistance value of the second resistor and the input potential corresponds to the average value of the output potential for the first output stage and the output potential of the second output stage.

4. A differential signal output circuit according to claim 1 wherein the first resistor and the second resistor correspond to a terminal resistance applied to the differential signal.

* * * * *